(12) United States Patent
Gunawan et al.

(10) Patent No.: US 8,797,058 B2
(45) Date of Patent: Aug. 5, 2014

(54) SOLAR CELL CHARACTERIZATION SYSTEM WITH AN AUTOMATED CONTINUOUS NEUTRAL DENSITY FILTER

(75) Inventors: Oki Gunawan, Fair Lawn, NJ (US); Bao Lei, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 707 days.

(21) Appl. No.: 13/039,940

(22) Filed: Mar. 3, 2011

(65) Prior Publication Data

US 2012/0223733 A1   Sep. 6, 2012

(51) Int. Cl.
    *G01R 31/26* (2014.01)
    *G01D 5/34*  (2006.01)
    *H01J 1/56*  (2006.01)

(52) U.S. Cl.
    USPC ............................ 324/761.01; 250/229

(58) Field of Classification Search
    CPC .................................. G01D 5/34; G01D 5/32
    See application file for complete search history.

(56) References Cited

U.S. PATENT DOCUMENTS

| | | | |
|---|---|---|---|
| 4,129,823 A * | 12/1978 | van der Pool et al. | ... 324/761.01 |
| 4,205,265 A | 5/1980 | Staebler | |
| 4,656,419 A | 4/1987 | Garlick | |
| 4,891,582 A | 1/1990 | Weiser et al. | |
| 5,025,145 A | 6/1991 | Lagowski | |
| 5,508,625 A | 4/1996 | Adams | |
| 5,648,731 A | 7/1997 | Decker et al. | |
| 6,639,421 B1 | 10/2003 | Yoshino et al. | |
| 6,946,858 B2 * | 9/2005 | Matsuyama | ............. 324/761.01 |
| 7,309,850 B2 * | 12/2007 | Sinton et al. | ............... 250/203.4 |
| 8,432,177 B2 * | 4/2013 | Wang et al. | ............. 324/761.01 |

OTHER PUBLICATIONS

R.A. Sinton et al., "A quasi-steady-state open-circuit voltage method for solar cell characterization," 16th European Photovoltaic Solar Energy Conference (May 1-5, 2000), Glasgow, UK.
M. Wolf and H. Rauschenbach, "Series resistance effects on solar cell measurements," Adv. Energy Conv., vol. 3, pp. 455-479 (1963).
K.W. Mitchell et al., "Device analysis of CuInSe2 solar cells," IEEE Photovoltaic Specialists Conference, vol. 2, pp. 1461-1468 (1988).

* cited by examiner

*Primary Examiner* — Jermele M Hollington
*Assistant Examiner* — Hoang X Nguyen
(74) *Attorney, Agent, or Firm* — Vazken Alexanian; Michael J. Chang, LLC (57) ABSTRACT

Techniques for solar cell electrical characterization are provided. In one aspect, a solar testing device is provided. The device includes a solar simulator; and a continuous neutral density filter in front of the solar simulator having regions of varying light attenuation levels ranging from transparent to opaque, the continuous neutral density filter having an area sufficiently large to filter all light generated by the solar simulator, and wherein a position of the continuous neutral density filter relative to the solar simulator is variable so as to control a light intensity produced by the device. A solar cell electrical characterization system and a method for performing a solar cell electrical characterization are also provided.

7 Claims, 11 Drawing Sheets

NORMAL (LIGHT/DARK) J-V MEARUREMENT

FIG. 7B

PSEUDO J-V/Jsc-Voc MEARUREMENT

FRAME
LINEAR-TYPE CNDF

FIG. 17

FRAME
RADIAL-TYPE CNDF

SOLAR CELL CHARACTERIZATION SYSTEM WITH AN AUTOMATED CONTINUOUS NEUTRAL DENSITY FILTER

FIELD OF THE INVENTION

The present invention relates to solar cell technology and more particularly, to techniques for solar cell electrical characterization.

BACKGROUND OF THE INVENTION

Photovoltaic devices or solar cells have been recognized as one of the leading candidates of renewable energy sources capable of supplying large scale clean energy that the world needs. The key metric in solar cell performance is power conversion efficiency that can be measured from the J-V (current-voltage) characteristics under standard simulated solar radiation using a solar simulator system.

As part of an effort to push the power conversion efficiency in solar cells even higher, there is a need to perform a more comprehensive electrical characterization of the solar cell beyond basic "efficiency" measurements. Specifically, advanced characterization steps are needed, such as Dark-JV, Jsc-Voc (short circuit current—open circuit voltage) and Rseries (series resistance) Extraction (RsX), where one could obtain various parameters that reveal some information about junction characteristics, parasitic (shunt and series) resistance and pseudo J-V performance. This information is very valuable for solar cell research and development as this information provides deeper insight about which aspects of the solar cell still need improvement.

The Jsc-Voc and RsX measurements require a variable light intensity. Intuitively, varying light intensity could be achieved with a solar simulator by controlling a power level of the solar simulator, changing the distance between the solar cell and the solar simulator, or inserting neutral density filters with different attenuation factors. But these methods cannot be performed easily and effectively. Namely, constantly switching the solar simulator power level in a large dynamic range with a high rate will be very detrimental for the stability and lifetime of the lamp (typically a xenon lamp). Varying the distance would require some sort of mechanical assembly and associated controls to move the lamp up and down and thus would be impractical. Further, the resulting range of light intensities would be very limited and light uniformity would vary a lot. Inserting various neutral density filters is also unrealistic because too many filters will be needed, the process is difficult to automate and measurements cannot be performed at a reasonable speed.

Recently, most of the Jsc-Voc measurement works are based on a flash lamp method. See, for example, U.S. Pat. No. 7,309,850 issued to R. A. Sinton et al., entitled "Measurement of current-voltage characteristic curves of solar cells and solar modules" and R. A. Sinton et al., "A quasi-steady-state open-circuit voltage method for solar cell characterization," 16th European Photovoltaic Solar Energy Conference (May 1-5, 2000), Glasgow, UK, the contents of each of which are incorporated by reference herein. Using the flash lamp method, measurements can be performed rapidly by employing high speed electronics. This method, however, suffers several drawbacks. It requires a separate system from the standard solar simulator system, the measurement of Jsc is rather indirect since it actually measures the light intensity and Jsc is assumed to be proportional with this intensity, and the light source is not guaranteed to have the same solar spectrum throughout a large range of intensities. On top of these drawbacks, additional light source setup and requirements or high speed electronics raise the cost of such a system, thus limiting its popularity.

Therefore, improved variable light intensity measurement techniques for advanced solar cell characterization, such as Jsc-Voc and RsX measurements, would be desirable.

SUMMARY OF THE INVENTION

The present invention provides techniques for solar cell electrical characterization. In one aspect of the invention, a solar testing device is provided. The device includes a solar simulator; and a continuous neutral density filter in front of the solar simulator having regions of varying light attenuation levels ranging from transparent to opaque, the continuous neutral density filter having an area sufficiently large to filter all light generated by the solar simulator, and wherein a position of the continuous neutral density filter relative to the solar simulator is variable so as to control a light intensity produced by the device In another aspect of the invention, a solar cell electrical characterization system is provided. The system includes a solar testing device having a solar simulator and a continuous neutral density filter having regions of varying light attenuation levels ranging from transparent to opaque, the continuous neutral density filter having an area sufficiently large to filter all light generated by the solar simulator; and a solar cell under test, wherein the continuous neutral density filter is located between the solar simulator and the solar cell under test, and wherein a position of the continuous neutral density filter relative to the solar simulator and the solar cell under test is variable so as to control a light intensity falling on the solar cell under test.

In yet another aspect of the invention, a method for performing a solar cell electrical characterization is provided. The method includes the following steps. A shutter of a solar simulator is opened to cause light to be emitted from the solar simulator, the solar simulator being part of a solar cell characterization system having the solar simulator and a continuous neutral density filter having regions of varying light attenuation levels ranging from transparent to opaque, wherein the continuous neutral density filter is located between the solar simulator and a solar cell under test. A transparent region of the continuous neutral density filter having no light attenuation is positioned between the solar simulator and the solar cell under test. Light J-V data is obtained from the solar cell under test. The continuous neutral density filter is moved to position a region of higher light attenuation between the solar simulator and the solar cell under test. Jsc-Voc data are obtained from the solar cell under test. The shutter is closed to prevent light from being emitted from the solar simulator. Dark J-V data are obtained from the solar cell under test. The shutter is opened to cause light to be emitted from the solar simulator. The continuous neutral density filter is moved to position a plurality of regions of lower light attenuation between the solar simulator and the solar cell under test. Three J-V curves are obtained from the solar cell under test to obtain RsX data for the solar cell under test.

A more complete understanding of the present invention, as well as further features and advantages of the present invention, will be obtained by reference to the following detailed description and drawings.

DETAILED DESCRIPTION OF PREFERRED EMBODIMENTS

Figure 1:
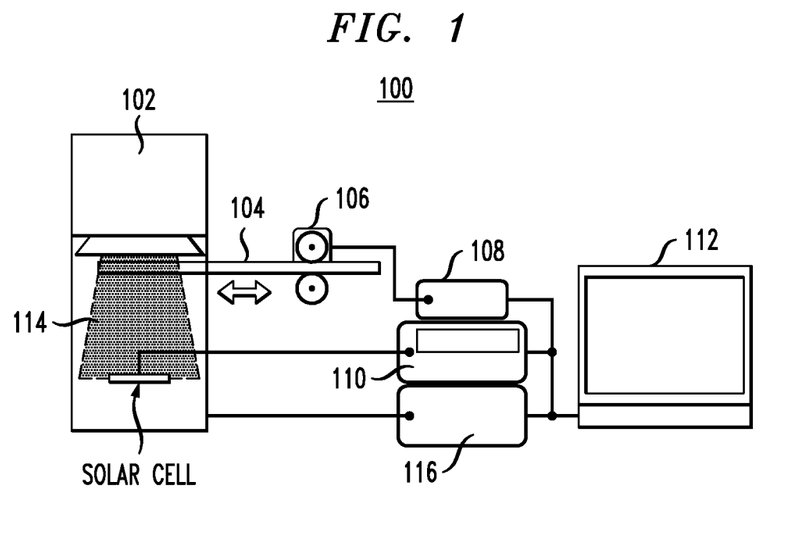
FIG. 1 is a diagram illustrating an exemplary solar cell characterization system according to an embodiment of the present invention.

Provided herein is a solar cell characterization system having an automated, large area continuous neutral density filter (CNDF) positioned between a solar simulator and a solar cell under test to control the light intensity falling on the solar cell. FIG. 1, for example, is a diagram illustrating exemplary solar cell characterization system 100. Solar cell characterization system 100 includes a solar testing device and a solar cell under test. The solar testing device includes a solar simulator 102, an automated CNDF 104, a motor 106, a motor controller 108, a J-V source meter 110 and a computer 112. Solar simulator 102 and J-V source meter 110 are standard items in most solar cell laboratories. Thus, these components of the testing device are not described further herein. An exemplary apparatus that may serve as computer 112 in system 100 is provided in FIG. 19 (described below).

Solar simulator 102 contains a lamp, e.g., a xenon, halogen or LED lamp, that will be used as a light source to create light 114 during the solar cell characterization steps (described below). The intensity of light 114 produced by the lamp is governed by light source controller 116 (e.g., a power supply) which is under the control of computer 112. Light 114 can be turned 'on' or 'off' a shutter on the solar simulator (not shown) which swings in or out blocking the light passage (thus the lamp itself is not switched on and off, but the shutter controls whether or not the light produced by the lamp is emitted or not). The shutter can also be under the control of light source controller 116. During the solar cell characterization steps, source meter 110 takes J-V data from the solar cell under test while the software controls motor 106 through motor controller 108. See description below.

Figure 16:
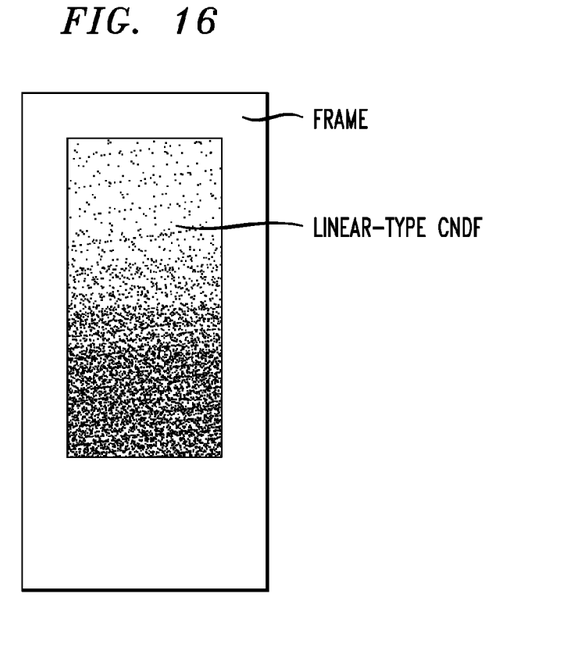
FIG. 16 is an image of a linear-type CNDF according to an embodiment of the present invention.
Figure 17:
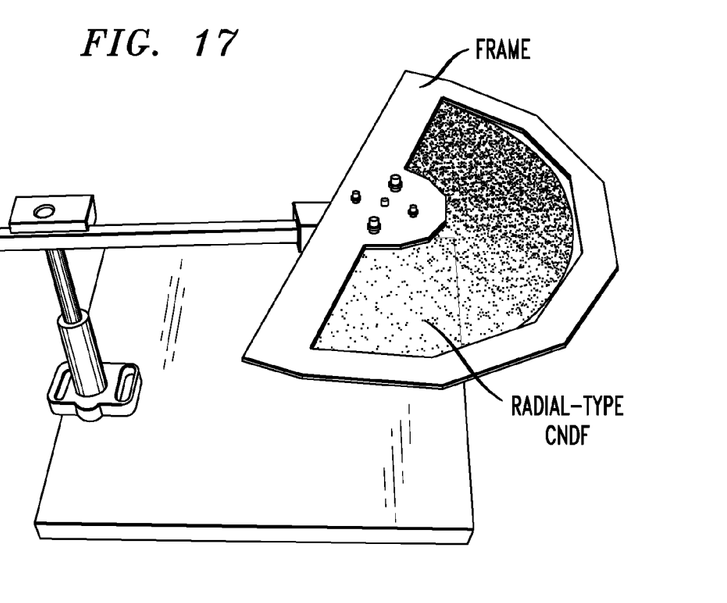
FIG. 17 is an image of a radial-type CNDF according to an embodiment of the present invention.

A neutral density filter is a filter that provides constant attenuation for all different wavelengths. A CNDF has a range of light attenuation levels (or optical density) from totally transparent to opaque. A blank area where no filter is present is used to allow the total transparency or 100% light transmission (see FIGS. 2 and 3, described below). A CNDF could be fabricated by depositing a thin metal layer with varying thickness or paint-brush spray on glass to achieve different light attenuation. Another simple way to fabricate a CNDF is to print a smooth gradation of black to white image on a transparency sheet using an ink jet printer as shown in FIGS. 16 and 17, described below. The CNDFs (both linear and radial) presented for use herein are large area filters. The term "large area" here means that the area of the filter is larger than the solar simulator's illumination area or illuminated area (see, for example, FIG. 11, described below) which is typically around 8 centimeters (cm)×8 cm. This illumination area is much larger than the solar cell area. What is important is the light level on the solar cell under test can be controlled using the CNDF. In contrast, commercially available CNDFs are only available in small sizes, e.g., 2.5 cm×10 cm.

Figure 2:
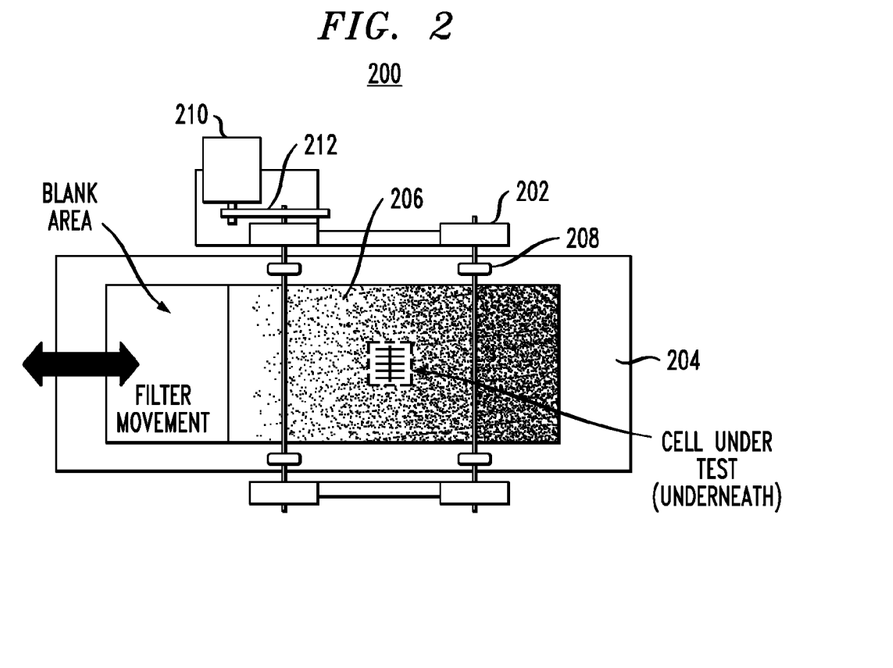
FIG. 2 is a diagram illustrating an exemplary linear continuous neutral density filter (CNDF) mechanical actuator assembly that may be used in the system of FIG. 1 according to an embodiment of the present invention.
Figure 3:
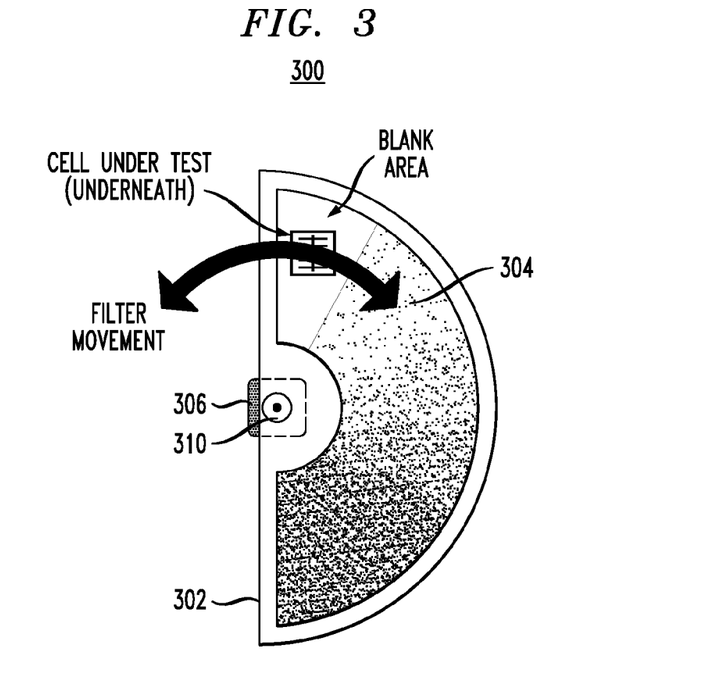
FIG. 3 is a diagram illustrating an exemplary radial CNDF mechanical actuator assembly that may be used in the system of FIG. 1 according to an embodiment of the present invention.

Two types of CNDFs can be used in accordance with the present techniques, a linear CNDF and a radial CNDF. CNDF 104 in FIG. 1 generically represents either a linear or radial CNDF. Detailed depictions of linear and radial CNDF filters are shown in FIGS. 2 and 3, respectively. The linear type CNDF is more suitable for large area solar cells but requires more complicated mechanical assembly, more components and has a larger footprint. The radial type CNDF is only suitable for small area solar cells but has fewer components, a simpler mechanical assembly and a smaller footprint.

System 100 uses a mechanical actuator assembly which consists of a support structure (not shown) and a motor, i.e., motor 106, that provide support and motion to the CNDF filter. Motor controller 108, controlled from computer 112, provides the drive signal to motor 106.

Figure 4:
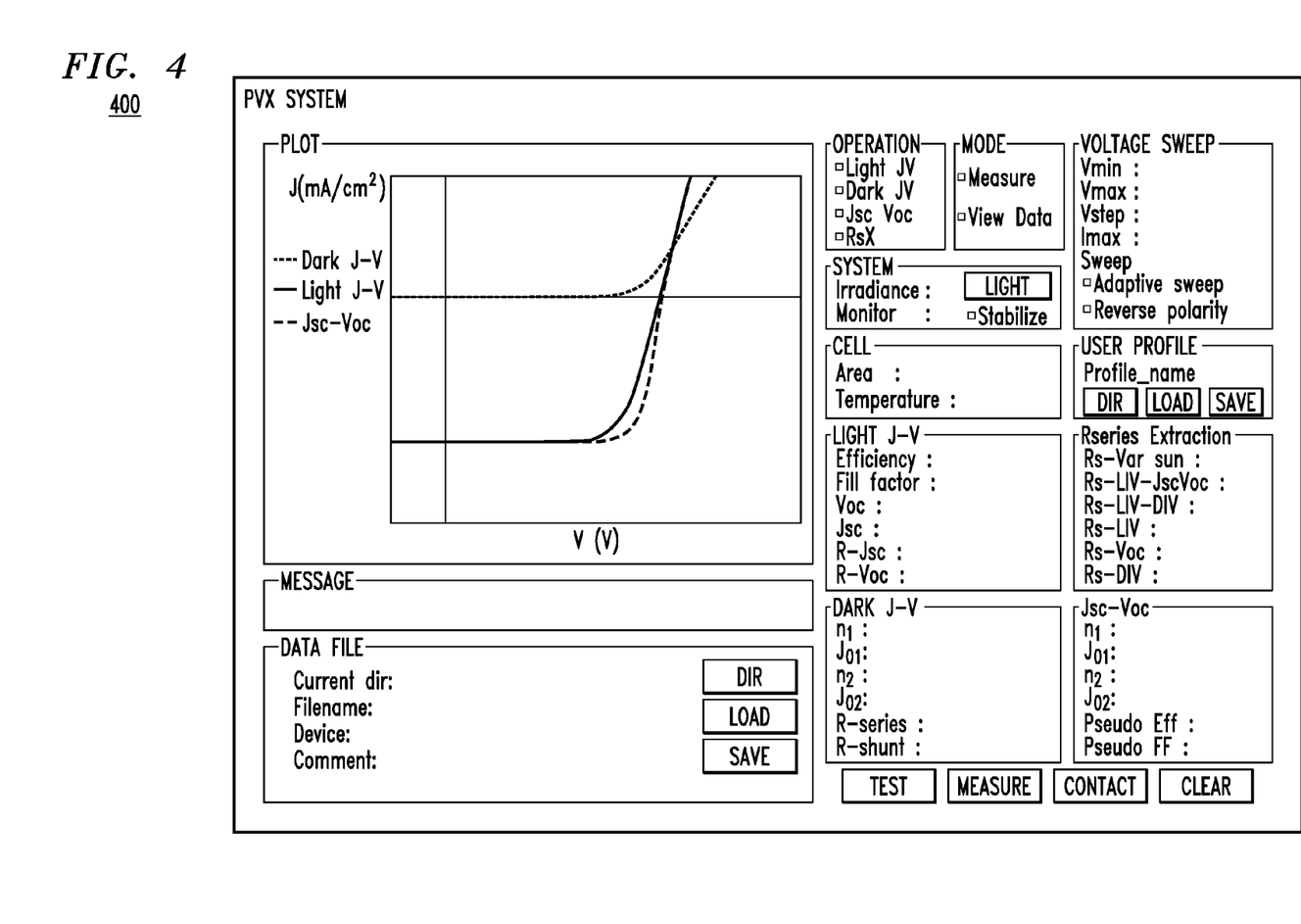
FIG. 4 is a diagram illustrating an exemplary graphical user interface that may be presented to a user of the system of FIG. 1 according to an embodiment of the present invention.

A software system, e.g., loaded onto computer 112, provides control over the measurement process. The software system communicates with source meter 110 (to read the electrical J-V (current-voltage) data from the solar cell under test), solar simulator 102 and motor controller 108. Another abbreviation for current-voltage is I-V which has the same meaning as J-V. The software has a curve-fitting routine to perform parameter extraction of all J-V data. Curve-fitting and parameter extraction for solar cell J-V curves are techniques known to those of skill in the art and thus are not described further herein. The software is also programmed with additional functions useful for solar cell testing such as solar simulator light stabilization and solar cell light-soaking test. The light stabilization function utilizes a light intensity sensor (not shown), typically a silicon photodetector, to monitor the light intensity of the solar simulator. Any deviation from the target intensity (typically 1 sun) will be corrected by the computer program by adjusting the power of the solar simulator via the light source controller. The solar cell light-soaking test can be achieved by programming a certain sequence of solar cell testing using the computer. For example, the solar cell can be subjected to hours of light soaking while the cell performance is monitored periodically at a certain time interval (by way of example only, every 10 minutes). A user of system 100 can save and load the measurement data and can also make a summary of the device parameters that have been measured. An exemplary graphical user interface of the software is shown in FIG. 4, described below.

As highlighted above, there are two types of CNDFs that can be used in system 100, a linear CNDF and a radial CNDF. FIG. 2 is a diagram illustrating exemplary linear CNDF mechanical actuator assembly 200. Linear CNDF mechanical actuator assembly 200 includes a chassis 202, a filter frame 204, a linear CNDF 206 mounted to filter frame 204 (using, e.g., double-sided tape or glue), rollers 208 mounted to chassis 202, stepper motor 210 and gear train 212 connecting stepper motor 210 to rollers 208. A stepper motor is a motor capable of turning in a series of tiny but precise angular steps and is controlled using a set of digital power signals. Thus a precise amount of rotation can be achieved easily.

During operation, a solar cell under test is positioned beneath the assembly, i.e., beneath CNDF 206, as shown in FIG. 2. Stepper motor 210 then actuates filter frame 204/CNDF 206 relative to chassis 202 by way of rollers 208. Namely, stepper motor 210 turns one or more of rollers 208 which are in contact with and roll along a (top or bottom) surface of filter frame 204. According to an exemplary embodiment, stepper motor 210 drives only the roller 208 that is directly connected to the motor through the gears. The other rollers 208 are passive rollers as they don't drive the filter but only allow the filter to move freely. By this action, filter frame 204/CNDF 206 are actuated side to side (e.g., left-to-right and right-to-left in FIG. 2) depending on whether stepper motor 210 turns clockwise or counter clockwise. Since the speed at which the motor turns is likely not the same as the desired speed for the rollers, gear train 212 serves to coordinate the speed of the motor with the desired speed of the rollers, e.g., through the use of reduction gears. This use of reduction gears would be apparent to one of skill in the art and thus is not described further herein. As a result of the side to side movement, different areas (with different attenuation factors, i.e., ranging from a blank area (totally transparent) to an opaque area (that does not let light pass through)) of the CNDF can be passed in front of the solar simulator/light source (see FIG. 1), i.e., between the solar simulator/light source and the solar cell under test both of which are stationary. Since the CNDF is positioned between the solar simulator/light source and the solar cell under test, the CNDF controls the light intensity falling on the solar cell. In other words, a position of the CNDF (relative to the solar simulator/light source and the solar cell) can be varied so as to control a light intensity produced by the device. Further, the present solar cell characterization system allows variable and continuous intensity control of the solar simulator while maintaining the same solar spectrum, which means that the neutral density filter imposes the same amount of attenuation across all wavelengths. Thus, the relative shape of the light spectrum remains the same, and only the amplitude of this intensity spectrum gets scaled down.

FIG. 3 is a diagram illustrating exemplary radial CNDF mechanical actuator assembly 300. Radial CNDF mechanical actuator assembly 300 includes a filter frame 302, a radial CNDF 304 mounted to filter frame 302 and stepper motor 306. As shown in FIG. 3, motor 306 is attached to filter frame 302 by way of a gear assembly 310. Actuation of filter frame 302/CNDF 304 occurs by stepper motor turning in a clockwise or counterclockwise manner, thereby turning filter frame 302/CNDF 304 in the same clockwise or counterclockwise direction (see FIG. 3). As a result of the rotational movement, different areas (with different attenuation factors, i.e., ranging from a blank area (totally transparent) to an opaque area (that does not let light pass through)) of the CNDF filter can be passed in front of the solar simulator/light source (see FIG. 1), i.e., between the solar simulator/light source and the solar cell under test both of which are stationary. Since the CNDF is positioned between the solar simulator/light source and the solar cell under test, the CNDF controls the light intensity falling on the solar cell. In other words, a position of the CNDF (relative to the solar simulator/light source and the solar cell) can be varied so as to control a light intensity produced by the device.

CNDF 304 is depicted in FIG. 3 as having a radial shape (radiating from a common center), in this case a semi-circular (i.e., half-circle) shape, however, this configuration is merely exemplary. CNDF 304 may have any suitable semi-circular or complete (full) circle shape as desired. The half-circle shape is more compact (smaller footprint) than for example a full circle radial filter. However, the "dynamic range" of attenuation is maintained to be the same in both cases (full or semi-circular), e.g., light transmission is changed from 1 to $10^{-4}$. As highlighted above, a radial-type CNDF (such as that shown in FIG. 3) can also be used in system 100 of FIG. 1 besides the linear-type CNDF as shown in FIG. 1.

FIG. 4 is a diagram illustrating exemplary graphical user interface (GUI) 400 that may be presented to a user of system 100 (of FIG. 1), for example, on a video display of computer 112 (see below), which would allow the user to perform a comprehensive solar cell J-V characterization. As shown in FIG. 4, interface 400 includes various panels to control the measurement and to display the results of the parameter extraction. Interface 400 allows users to perform a four step device characterization and analysis (as is described below). Interface 400 is divided into panels according to their functions. The "Operation" panel allows the user to choose the measurement. The "Mode" panel allows the user to choose between measurement or data-viewing mode. The "Voltage Sweep" panel is for setting the J-V sweep range. The "System" panel is to control the solar simulator light. The "User profile" panel is to store and retrieve system settings belonging to certain users. The "Cell" panel is to specify basic parameters of the cell such as area and temperature. The "Light J-V," "Dark J-V," "Jsc-Voc" and "Rseries extraction" panels are to display the measurement results. The "Data file" panel is to store or retrieve measurement results.

Figure 5:
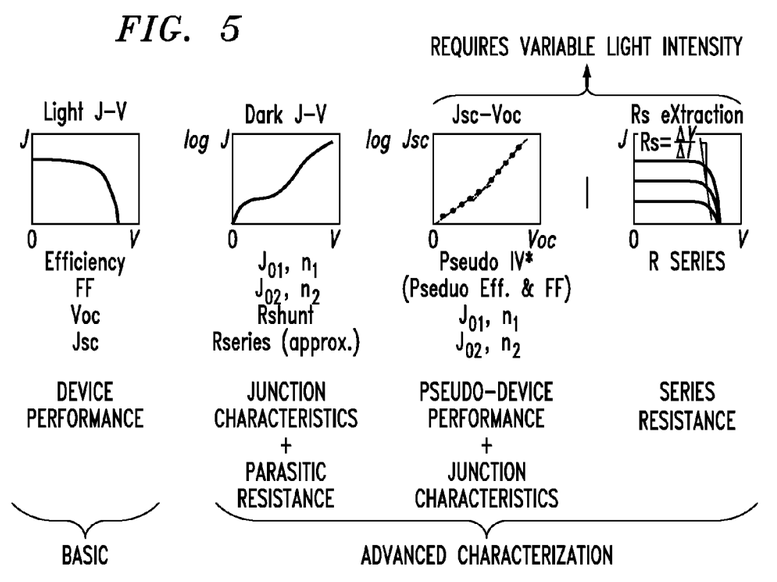
FIG. 5 is a diagram illustrating four steps needed for a comprehensive electrical (J-V) characterization of a solar cell according to an embodiment of the present invention.

As highlighted above, in order to perform a complete, comprehensive electrical characterization of a solar cell (which is needed to increase the power conversion efficiency), advanced characterization steps in addition to basic efficiency measurements are needed. FIG. 5 is a diagram illustrating four steps needed for a comprehensive electrical (J-V) characterization of a solar cell, namely, light J-V which is a basic characterization step, dark J-V, Jsc-Voc (short circuit current vs. open circuit voltage) and Rseries (series resistance) Extraction (RsX) which are advanced characterization steps. The Jsc-Voc and RsX steps require variable light intensity, an issue that is solved by the present techniques. As shown in FIG. 5, light J-V characterizes overall device performance, dark J-V diode characteristics and parasitic resistance, Jsc-Voc characterizes pseudo-device performance and junction characteristics, and RsX characterizes series resistance. Diode characteristics (also commonly termed junction characteristics) refer to the diode behavior of the solar cell that can be described using the standard diode equation:

$$J=J_0*[\exp(V/n*V_T)-1],$$

wherein $J_0$ is the reverse saturation current, n is the diode ideality factor and $V_T=k_B T/q$ is the thermal voltage where $k_B$, T and q are the Boltzmann constant, temperature and electron's charge, respectively. Parasitic resistance in solar cells are shunt (or leakage) resistance and series resistance. The shunt resistance (Rp) shorts the current and the series resistance (Rs) dissipates the output power. The series resistance in the solar cell mainly arises from the top and bottom metal contact of solar cells and resistance of the "emitter" (top layer) layer of the solar cell.

Figure 6:
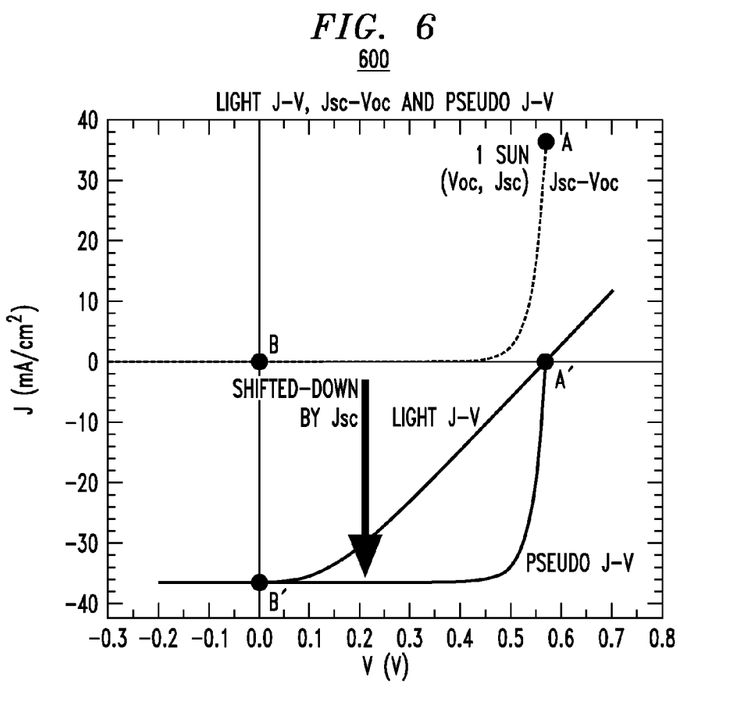
FIG. 6 is a graph illustrating standard light J-V and pseudo J-V traces of a solar cell with very high series resistance according to an embodiment of the present invention.

A pseudo J-V curve of a solar cell is essentially a shifted Jsc-Voc (short circuit current vs open circuit voltage) curve that reflects the J-V characteristics of the solar cell if the series resistance is absent. Both pseudo J-V and standard light J-V curves are shown in FIG. 6. FIG. 6 is a graph 600 illustrating standard light J-V and pseudo J-V traces of a solar cell with very high series resistance (e.g., greater than about 10 ohms per square centimeter (ohm-cm$^2$)). In graph 600, voltage V (measured in volts (V)) is plotted on the x-axis and current J (measured in milliamps per square centimeter (mA/cm$^2$) is plotted on the y-axis.

Figure 7A:
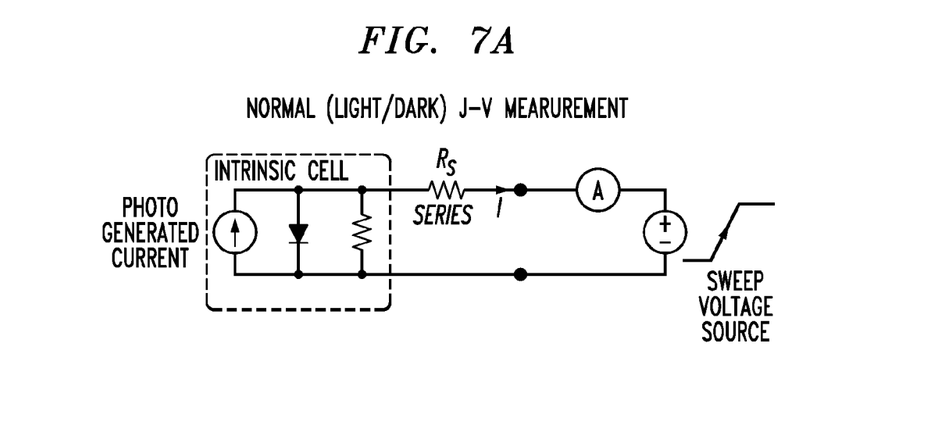
FIG. 7A is a diagram illustrating normal (standard) light J-V measurement according to an embodiment of the present invention.
Figure 7B:
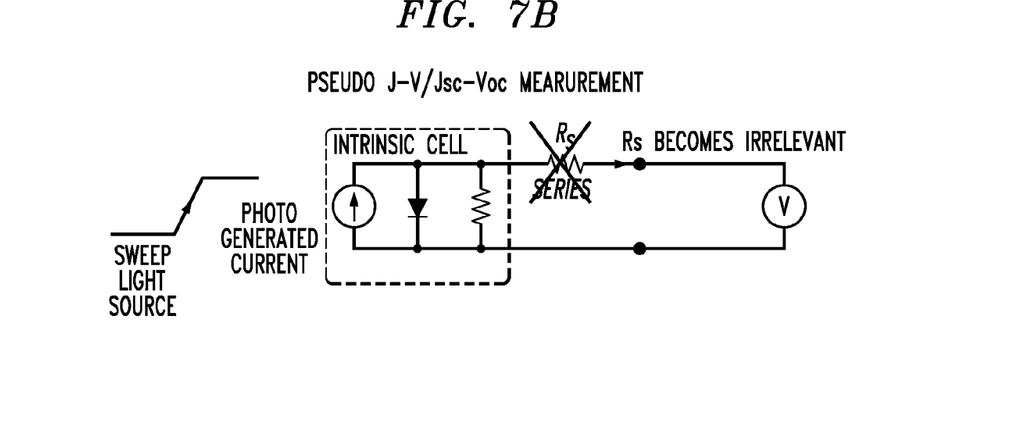
FIG. 7B is a diagram illustrating pseudo J-V measurement according to an embodiment of the present invention.

In standard (light J-V) measurement, one sweeps the solar cell with a voltage source. See FIG. 7A. In Jsc-Voc measurement, one essentially sweeps the current source (from photo generated current) within the solar cell by controlling the light intensity. See FIG. 7B. FIGS. 7A-B are diagrams illustrating normal (standard) light J-V measurement versus pseudo J-V measurement. An intrinsic cell is the device components of the solar cells without the series resistance (Rs). Rs is considered an external factor due, e.g., to series resistance in the metal contact grid. Thus it is often useful to exclude this Rs effect by measuring pseudo J-V measurements.

The short circuit current (Jsc) and open circuit voltage (Voc) are measured at terminals of the solar cell. For example, when the open circuit voltage (Voc) is measured using a voltmeter, the voltmeter practically draws no current. Thus the series resistance (Rs) has practically no effect in the measurement (see FIG. 7B). Similarly, when the short circuit current is measured, all current flows to the ampmeter regardless of what the series resistance is. As a result, the Jsc-Voc points measured reflect the intrinsic J-V characteristics that is free from series resistance effects. However if the series resistance is very high (e.g., greater than about 10 ohm-cm$^2$) this approximation will break down because the voltage drop across the series resistance becomes very large compared to that of the solar cell (thus the J-V characteristics are dominated by the series resistance and not by the solar cell).

Figure 8A:
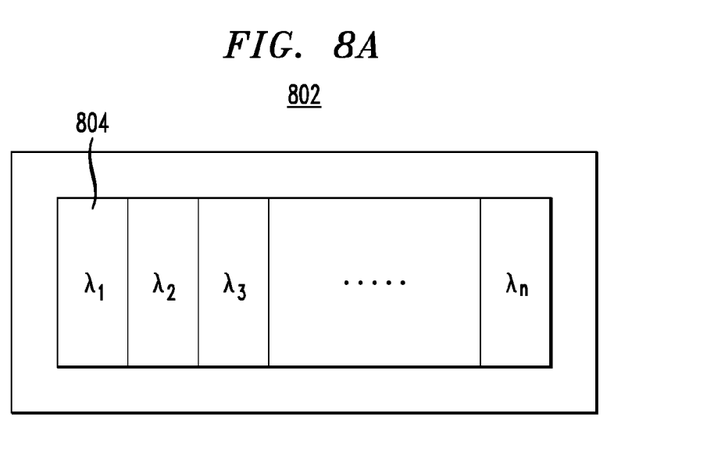
FIG. 8A is a diagram illustrating an exemplary linear type bandpass filter containing a plurality of optical filters for quantum efficiency measurement according to an embodiment of the present invention.
Figure 8B:
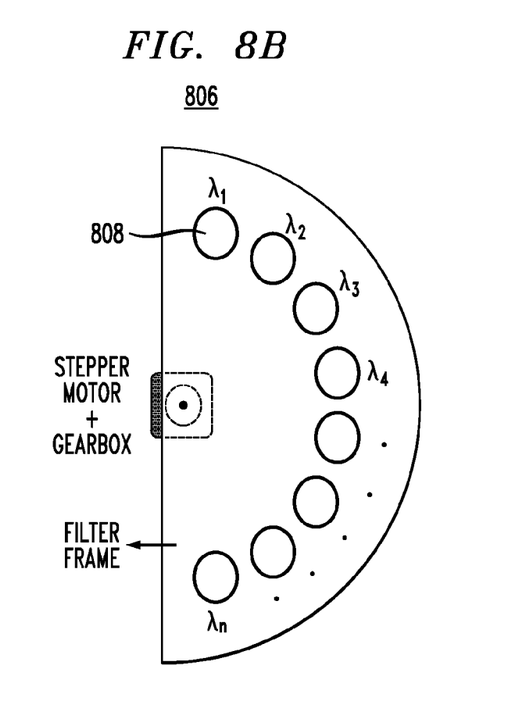
FIG. 8B is a diagram illustrating an exemplary radial type bandpass filter containing a plurality of optical filters for quantum efficiency measurement according to an embodiment of the present invention.

From the Jsc-Voc curves one could extract the diode parameters: reverse saturation current ($J_{01}$) and diode ideality factor ($n_1$) more accurately since the Jsc-Voc measurement is free from series resistance effect that will otherwise bend the J-V curve down at high voltage. If the Jsc-Voc curve is shifted down by Jsc at 1 sun illumination (see, for example. FIG. 6, described above), the Jsc-Voc curve will meet the normal Light J-V curve at the Jsc and Voc points. This shifted Jsc-Voc is also called pseudo Light J-V. From the pseudo Light J-V, one can measure the pseudo efficiency (PEff) and pseudo fill factor (PFF) values that represent the "best maximum" efficiency of the cell if the series resistance is absent. The pseudo efficiency and pseudo fill factor calculations are exactly the same as that of the "standard" efficiency and fill factor. This pseudo efficiency (PEff) and pseudo fill factor (PFF) information is very useful as it reveals the maximum efficiency the cell could potentially have, and helps to distinguish whether a certain cell has a problem of series resistance or an intrinsic device problem. For example, if the efficiency is much lower than the pseudo efficiency that means that the power loss due to series resistance is very severe and the cell intrinsically could perform much better if this series resistance is minimized Besides performing a four-step J-V characterization as described above (i.e., light J-V, dark J-V, Jsc-Voc and RsX), as an additional option the present variable light intensity mechanical assembly and software can advantageously be used to implement a fifth measurement function, i.e., a simple quantum efficiency spectrum measurement. Another filter containing a number of optical bandpass filters covering the wavelength range of interest for the solar cell which is typically from 300 nanometers (nm) to 1400 nm would be needed. This filter can be a linear type filter as shown in FIG. 8A or a radial type filter as shown in FIG. 8B. Linear bandpass filter 802 (FIG. 8A) and radial bandpass filter 806 (FIG. 8B) each contain a plurality of optical filters 804 and 808, respectively, for quantum efficiency measurement. As shown in FIGS. 8A and 8B, each optical filter 804 and 808, respectively, covers a different wavelength λ. In the example shown in FIG. 8A, there are 7 filters shown. In the example shown in FIG. 8B, there are 8 filters shown.

According to an exemplary embodiment, solar cell characterization system 100 (see above) having a CNDF would be used to perform the four-step J-V characterization as described above (i.e., light J-V, dark J-V, Jsc-Voc and RsX). The CNDF would then be replaced with the optical bandpass filter (e.g., linear bandpass filter 802 of FIG. 8A or radial bandpass filter 806 of FIG. 8B) and quantum efficiency measurements would additionally be performed. In one example, the optical bandpass filter is configured to have the same physical dimensions as the CNDF so that the two filters can be swapped into/out of system 100 with ease. By way of example only, when a linear CNDF and a linear optical bandpass filter (such as that shown in FIG. 8A) are used, each filter could be the same size and could be attached to filter frame 204 (see, FIG. 2, described above) in the same manner.

In this example where a bandpass filter is used in system 100 (of FIG. 1), as the bandpass filter moves the solar cell under test will receive a monochromatic light set by the bandpass filter passing above it. The system will measure the photocurrent (the short circuit current) of the solar cell. Then by comparing the measured photocurrent with a similar measurement on a reference solar cell with known quantum efficiency (i.e., measurement on a reference solar cell done separately in place of the cell under test), one can calculate the external quantum efficiency of the cell under test. The quantum efficiency of the cell under test is given by: $QE_X = QE_{Ref} \times$ $I_X/I_{Ref}$, wherein QE is the quantum efficiency, J is the photocurrent and X and Ref subscripts refer to the cell under test and the reference cell, respectively.

Figure 9:
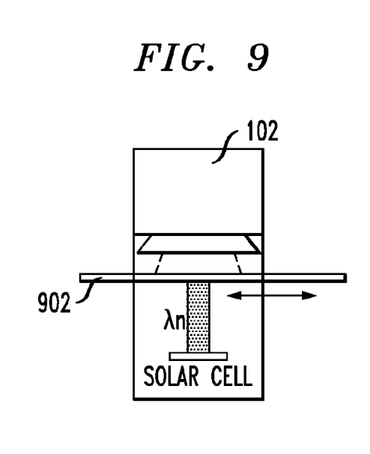
FIG. 9 is a diagram illustrating an optical bandpass filter being used in conjunction with the system of FIG. 1 according to an embodiment of the present invention.

FIG. 9 is a diagram illustrating an optical bandpass filter 902 being used in conjunction with solar cell characterization system 100 (of FIG. 1). It is notable that for ease of depiction, only a portion of system 100 is shown in FIG. 9, however, the remainder of the system is the same as that shown in FIG. 1 and described above. During operation, optical bandpass filter 902 passes above the solar cell. The actuation of the filter was described above, and that description is incorporated by reference herein. As also described above, the solar cell under test and solar simulator 102 remain stationary, while filter 902 moves.

In practice, one could only have a limited number of bandpass filters as the filter length is finite. Therefore only a limited number of data points can be obtained. Nevertheless, since practically all know quantum efficiency curves of solar cells are smoothly varying (no fast fluctuation involved), this method will yield a sufficiently good approximation to the real quantum efficiency curve. Considering a dedicated quantum efficiency system is very expensive (e.g., about 50,000 dollars and above as of the year 2010), this extra option brings a high value-added functionality to the present solar cell characterization system. By comparison, in the case of variable light intensity (using the variable light filters described above), one can have any arbitrary amount of light attenuation by controlling the position of the linear or radial light filter. Thus the resolution is "analog."

Figure 10:
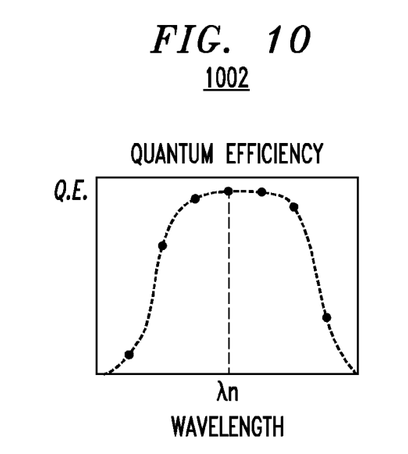
FIG. 10 is a graph illustrating quantum efficiency according to an embodiment of the present invention.

FIG. 10 is a graph 1002 illustrating quantum efficiency. In graph 1002, wavelength λ is plotted on the x-axis and quantum efficiency or Q.E. is plotted on the y-axis. Graph 1002 illustrates the resulting quantum efficiency data obtained from measurements using the set-up of FIG. 9.

An exemplary method of operating solar cell characterization system 100 will now be presented. FIGS. 11-14 are diagrams illustrating an exemplary methodology for performing a four step comprehensive solar cell electrical (J-V) characterization using system 100. As highlighted above, two types of CNDFs can be used in accordance with system 100, a linear CNDF and a radial CNDF. In FIGS. 11-14, the actions of both a linear CNDF and a radial CNDF are shown along with the corresponding characterization step. It is notable that the linear CNDF depicted has the same configuration as shown in FIG. 2 with a blank area on the left and which gets progressively darker moving from left to right. Similarly, the radial CNDF depicted has the same configuration as shown in FIG. 3 with a blank area on one end and which gets progressively darker as the filter is rotated (in this case counterclockwise).

The first step in the characterization process is a light J-V step. In this step, a light shutter (not shown) of solar simulator 102 is opened and filter 104 (linear CNDF or radial CNDF) is in a blank (no filter, no attenuation) position. See FIG. 11. Source meter 110 (see FIG. 1) takes the J-V data by sweeping the voltage and measuring the current. The software reads this data and calculates all necessary device parameters such as efficiency (Eff), fill factor (FF), short circuit current (Jsc) and open circuit voltage (Voc).

Figure 11:
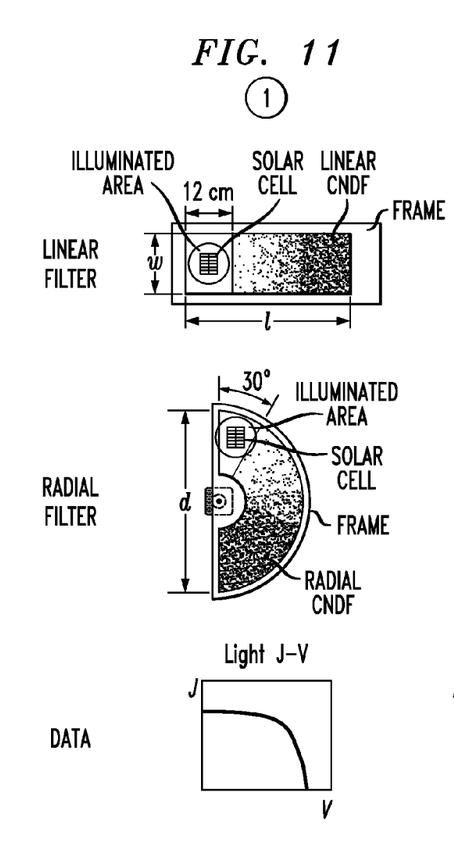
FIG. 11 is a diagram illustrating a first step in a solar cell electrical characterization process using the system of FIG. 1 (a light J-V step) according to an embodiment of the present invention.

FIG. 11 also illustrates that, as highlighted above, the area of the filter is larger than the solar simulator's illuminated area. According to an exemplary embodiment, the linear CNDF (the filter itself, excluding the frame) has a length l of from about 25 cm to about 75 cm and a width w of from about 10 cm to about 30 cm. The resulting area of the linear CNDF, given these exemplary dimensions, would be from about 300 square centimeters ($cm^2$) to about 1,875 $cm^2$. The length of the illuminated area, e.g., 12 cm, is shown for reference. According to an exemplary embodiment, the radial CNDF (the filter itself, excluding the frame) has a diameter d of from about 15 cm to about 40 cm. The resulting area of the radial CNDF, given these exemplary dimensions, would be from about 350 $cm^2$ to about 2,500 $cm^2$. The angle of the illuminated area, e.g., 30 degrees, is shown for reference.

The second step in the characterization process is a Jsc-Voc step. In this step, CNDF 104 moves slowly towards a darker region (higher light attenuation) (this movement from no attenuation to high attenuation can take, e.g., about 30 seconds) and source meter 110 repetitively measures short-circuit current (Jsc) and open-circuit voltage (Voc) rapidly to obtain Jsc-Voc data points while CNDF 104 is moving. In the case of the linear CNDF, CNDF 104 moves to the left to attain higher light attenuation. In the case of the radial CNDF, CNDF 104 rotates counterclockwise to attain higher light attenuation. See FIG. 12. Source meter 110 takes the measurements concurrently as CNDF 104 is moving slowly. This results in a faster measurement time. Namely, over the course of the filter movement, source meter 110 measures the Jsc-Voc data. According to an exemplary embodiment, source meter 110 takes about one data point each second. Each data point consists of a pair of Jsc and Voc measurements that were taken rapidly one after another within less than 0.25 seconds. CNDF 104 is moved by motor 106 by way of a motor controller 108 which is under the control of computer 112. Alternatively, it is also possible to have a user of the system move the CNDF manually by hand (i.e., without the use of an automated motor drive system).

Figure 12:
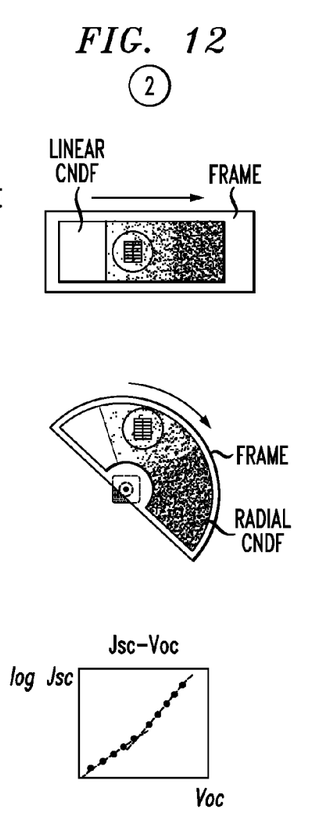
FIG. 12 is a diagram illustrating a second step in the characterization process (a short circuit current versus open circuit voltage (Jsc-Voc) step) according to an embodiment of the present invention.
Figure 13:
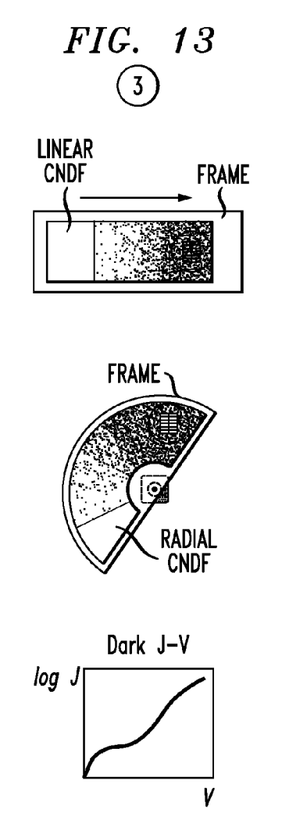
FIG. 13 is a diagram illustrating a third step in the characterization process (a dark J-V step) according to an embodiment of the present invention.

The software then extracts all necessary device parameters such as pseudo-efficiency (PEff) and pseudo fill factor (PFF). The diode ideality factors ($n_1$ and $n_2$) and reverse saturation current ($J_{01}$ and $J_{02}$) can also be extracted more accurately (as compared to Dark J-V data) since this data is free from series resistance effect (see above). The parameter extraction is based on a curve fitting of the J-V data with a standard one- or two-diode model. A one-diode model is a solar cell model containing only one diode (with parameters $J_{01}$ and $n_1$). A two-diode model has a second diode (with parameters $J_{02}$ and $n_2$). From the Light J-V and Jsc-Voc data one could also calculate the series resistance of the solar cell under test which provides an alternative method to the series resistance extraction in the RsX step, the fourth step, described below. In this alternative method the series resistance can be calculated as the difference of the voltage at the maximum power point (MPP) of the Light J-V and Jsc-Voc data divided by the current at that MPP point.

The third step in the characterization process is a Dark J-V step. In this step, the light shutter of solar simulator 102 is closed, i.e., solar simulator 102 is not emitting any light. See FIG. 13. Source meter 110 takes the J-V data again and the software reads this data and extracts all necessary cell parameters, such as diode ideality factors ($n_1$ and $n_2$), reverse saturation current ($J_{01}$ and $J_{02}$), shunt resistance (Rshunt) and series resistance (Rseries). As above, the parameter extraction is based on a curve fitting of the J-V data with a standard one- or two-diode model.

Figure 14:
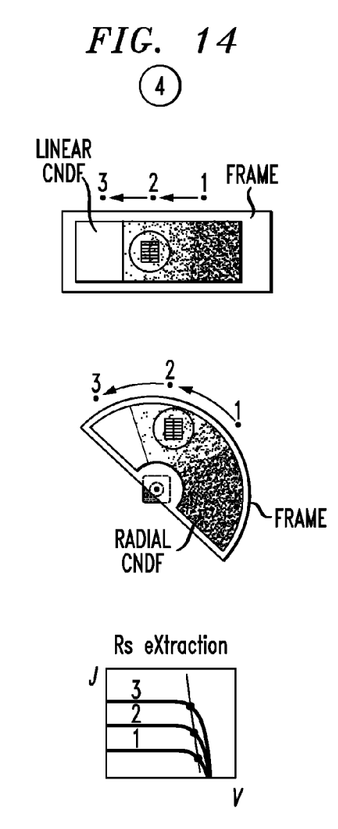
FIG. 14 is a diagram illustrating a fourth step in the characterization process (a Rseries Extraction (RsX) step) according to an embodiment of the present invention.

The fourth step in the characterization process is a RsX step. In this step, the light shutter of solar simulator 102 is again open. CNDF 104 moves back (to the right in the case of the linear CNDF or clockwise in the case of the radial CNDF) towards the lighter region (lower light attenuation) and the blank region (e.g., under the drive of motor 106). CNDF 104 stops moving at three positions as shown in FIG. 14 (one of them is a blank region) where source meter 110 takes the J-V data. The three positions correspond to three light intensity levels (which are based on the level of attenuation by the filter). One position should be at 100 percent (%) light intensity level (no attenuation) and the other positions are two slightly lower light intensity levels, such as 80% and 60% (slightly higher attenuation). The series resistance determined using RsX measurement's result is insensitive to the light intensity levels, for example one could choose 100%, 90%, 80% or 100%, 80%, 60%. The intensity level is proportional to the short circuit current produced by the solar cell under test. The software then calculates the series resistance of the solar cell under test based on the three J-V curves using a "variable light-intensity method." See, for example, M. Wolf and H. Rauschenbach, "Series resistance effects on solar cell measurements," Adv. Energy Conv., vol. 3, pp. 455-479 (1963) (hereinafter "Wolf"), the contents of which are incorporated by reference herein.

According to an exemplary embodiment, the light intensity in this fourth step is changed to three different levels and the J-V of the solar cell is measured at each intensity level. The three light intensity levels are chosen to be one at 100% and two others at slightly lower intensities such as approximately 80% and 60%. The series resistance could be calculated following the method described in Wolf. First, the maximum power point (call it point A) of the first curve (usually under 1 sun illumination) is chosen as the first intensity level and then a second point B is identified on the second J-V curve by going down by ΔIsc from A, where ΔJsc is the difference of the short circuit current between the first and second curve. The same procedure is repeated to identify point C on the third J-V curve. The l/slope of linear fit through point A, B and C will yield the series resistance.

As highlighted above, the solar cell electrical (J-V) characterization process using system 100 can be completely automated. In that exemplary configuration, the steps of the process are run and coordinated by computer 112. This completely automated methodology is further described in conjunction with the description of FIG. 18, below.

A user of system 100 does not necessarily have to perform all of these four operations at once. System 100 and its associated software allows the user to choose any combination of the four characterization steps to perform, or all of the steps. From these measurements, the user could obtain many parameters of the solar cells at once. A very good solar cell should have the following parameters to be as large as possible: efficiency, fill factor (also the pseudo efficiency and pseudo fill factor) and shunt resistance (Rshunt), but the following parameters have to be as small as possible: series resistance, reverse saturation current ($J_0$) and diode ideality factor ($n_1$ and $n_2$). The subscripts 1 and 2 refer to diode number 1 and 2, respectively in the two-diode model of a solar cell.

Figure 15:
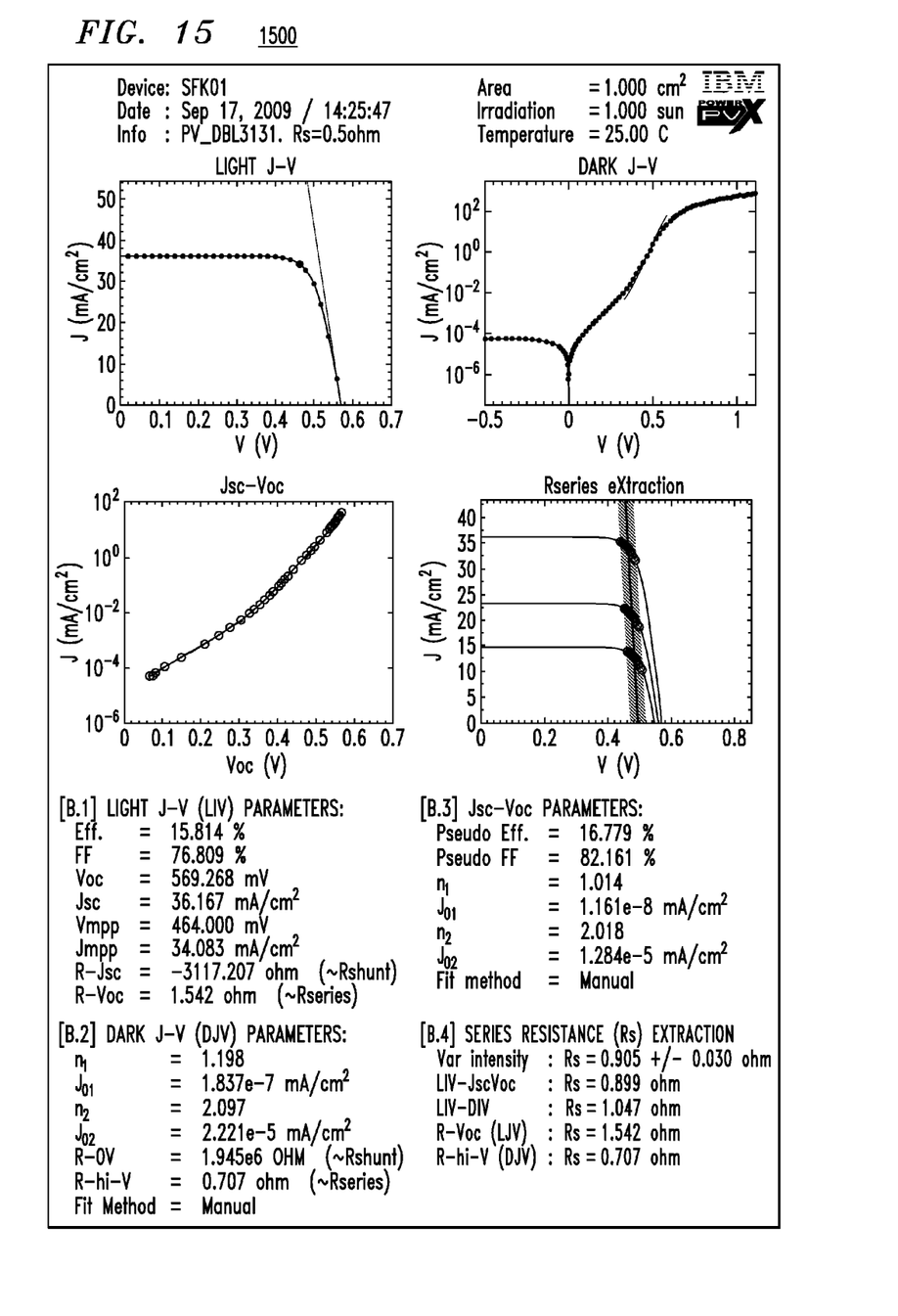
FIG. 15 is a diagram illustrating an exemplary report file according to an embodiment of the present invention.

Based on the measurements taken, the software can also generate a report file as shown in FIG. 15. FIG. 15 is a diagram illustrating exemplary report file 1500 from a measurement session. Report file 1500 summarizes plots and various solar cell parameters derived from the four step J-V characterization (Light JV, dark JV, Jsc-Voc and RsX). By performing this four step J-V characterization, system 100 serves as a very valuable and efficient tool for solar research and development.

FIG. 16 is an image of a linear-type CNDF. The CNDF shown in FIG. 16 was made by ink-jet printing a gradation of black to white pattern on a transparency film and mounting the film onto a frame. The frame should be black in color to block the light outside the filter area. FIG. 17 is an image of a radial-type CNDF. The CNDF shown in FIG. 17 was made in the same manner as the CNDF of FIG. 16. Specifically, the radial CNDF was made by ink jet printing a gradation of black to white pattern on a transparency film and mounting the film onto a black frame.

Figure 18:
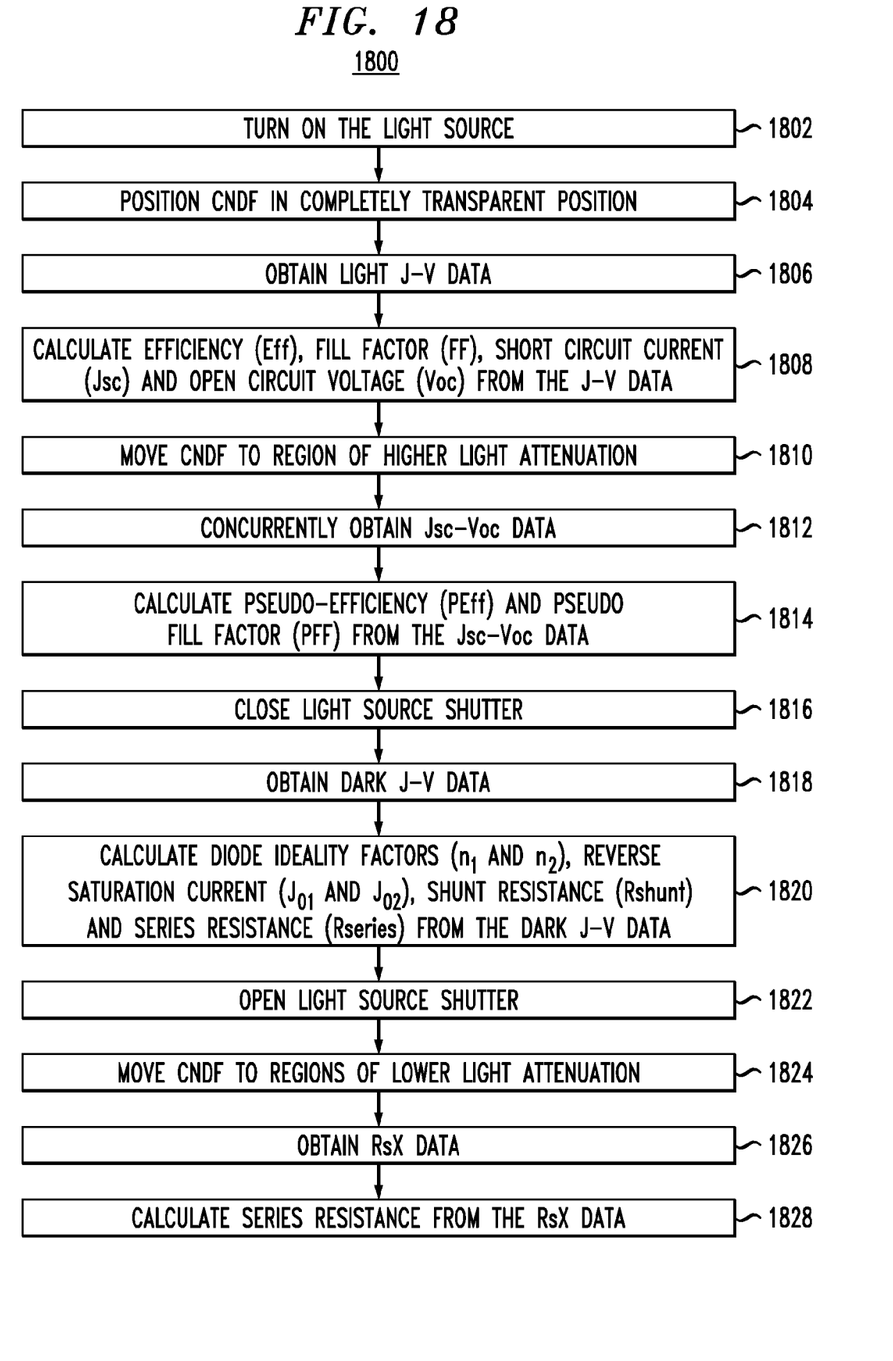
FIG. 18 is a diagram illustrating an exemplary methodology for performing a solar cell electrical characterization using the system of FIG. 1 according to an embodiment of the present invention.

As highlighted above, the present solar cell electrical (J-V) characterization process using solar cell characterization system 100 can be completely automated, i.e., run and coordinated by computer 112. By way of example only, FIG. 18 is a diagram illustrating exemplary automated methodology 1800 for performing a solar cell electrical characterization using system 100. In step 1802, a light source of solar simulator 102 is turned on. According to an exemplary embodiment, this is accomplished by opening a shutter on solar simulator 102, which as described above can be under the control of computer 112.

In step 1804, CNDF 104 is positioned in a completely transparent (blank, no attenuation) position. As described above, the present CNDFs have a blank area and the movement of the CNDFs can be coordinated by computer 112 (e.g., by way of motor 106 and motor control 108).

In step 1806, light J-V data is obtained from the solar cell under test. As described above, computer 112 can obtain this data by way of source meter 110. In step 1808, efficiency (Eff), fill factor (FF), short circuit current (Jsc) and open circuit voltage (Voc) are calculated from the J-V data. These calculations were described in detail above and that description is incorporated by reference herein.

In step 1810, CNDF 104 is moved to a region of higher light attenuation (e.g., by computer 112 by way of motor 106 and motor control 108). In step 1812, Jsc-Voc data are obtained from the solar cell under test (e.g., by computer 112 by way of source meter 110). According to an exemplary embodiment, the Jsc-Voc data are obtained concurrently with the movement of CNDF 104 (i.e., steps 1810 and 1812 are performed concurrently). In step 1814, pseudo-efficiency (PEff) and pseudo fill factor (PFF) are calculated from the Jsc-Voc data. These calculations were described in detail above and that description is incorporated by reference herein.

In step 1816, the light source is turned off (e.g., by closing the shutter on solar simulator 102 rather than turning off the light source itself). In step 1818, dark J-V data is obtained from the solar cell under test. In step 1820, diode ideality factors ($n_1$ and $n_2$), reverse saturation current ($J_{01}$ and $J_{02}$), shunt resistance (Rshunt) and series resistance (Rseries) are calculated from the dark J-V data. These calculations were described in detail above and that description is incorporated by reference herein.

In step 1822, the light source is turned back on again (e.g., by opening the shutter on solar simulator 102). In step 1824, CNDF 104 is moved to a plurality of regions of lower light attenuation (e.g., by computer 112 by way of motor 106 and motor control 108), one of which is a transparent (blank) region. According to an exemplary embodiment, three regions of different light attenuation are used (e.g., corresponding to 100% (by way of the transparent region), 80% and 60% light intensity levels, respectively). In step 1826, RsX data is obtained from the solar cell under test by obtaining three J-V curves at those three light intensity levels. In step 1828, series resistance is calculated from the RsX data. This calculation was described in detail above and that description is incorporated by reference herein.

Figure 19:
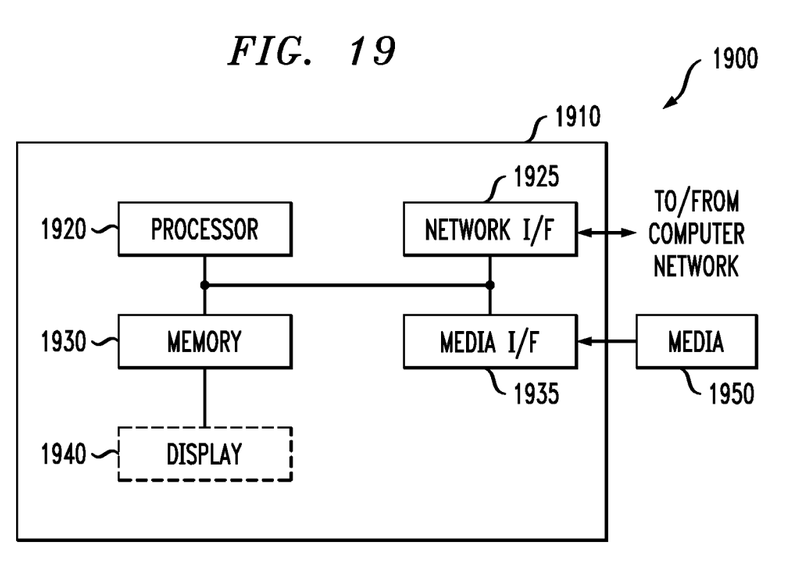
FIG. 19 is a diagram illustrating an exemplary apparatus for performing one or more of the methodologies presented herein according to an embodiment of the present invention.

Turning now to FIG. 19, a block diagram is shown of an apparatus 1900 for implementing one or more of the methodologies presented herein. By way of example only, apparatus 1900 can be configured to implement one or more of the steps of methodology 1800 of FIG. 18 for performing a solar cell electrical characterization, in conjunction with a solar cell characterization system, such as system 100 of FIG. 1. As highlighted above, system 100 includes a computer (e.g., computer 112). Apparatus 1900 can be configured to serve as computer 112 in system 100.

Apparatus 1900 comprises a computer system 1910 and removable media 1950. Computer system 1910 comprises a processor device 1920, a network interface 1925, a memory 1930, a media interface 1935 and an optional display 1940. Network interface 1925 allows computer system 1910 to connect to a network, while media interface 1935 allows computer system 1910 to interact with media, such as a hard drive or removable media 1950.

As is known in the art, the methods and apparatus discussed herein may be distributed as an article of manufacture that itself comprises a machine-readable medium containing one or more programs which when executed implement embodiments of the present invention. For instance, when apparatus 1900 is configured to implement one or more of the steps of methodology 1800 the machine-readable medium may contain a program configured to open a shutter of a solar simulator to cause light to be emitted from the solar simulator, the solar simulator being part of a solar cell characterization system having the solar simulator and a continuous neutral density filter having regions of varying light attenuation levels ranging from transparent to opaque, wherein the continuous neutral density filter is located between the solar simulator and a solar cell under test; position a transparent region of the continuous neutral density filter having no light attenuation between the solar simulator and the solar cell under test; obtain light J-V data from the solar cell under test; move the continuous neutral density filter to position a region of higher light attenuation between the solar simulator and the solar cell under test; obtain Jsc-Voc data from the solar cell under test; close the shutter to prevent light from being emitted from the solar simulator; obtain dark J-V data from the solar cell under test; open the shutter to cause light to be emitted from the solar simulator; move the continuous neutral density filter to position a plurality of regions of lower light attenuation between the solar simulator and the solar cell under test; and obtain three J-V curves from the solar cell under test to obtain RsX data for the solar cell under test.

The machine-readable medium may be a recordable medium (e.g., floppy disks, hard drive, optical disks such as removable media 1950, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1920 can be configured to implement the methods, steps, and functions disclosed herein. The memory 1930 could be distributed or local and the processor device 1920 could be distributed or singular. The memory 1930 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1920. With this definition, information on a network, accessible through network interface 1925, is still within memory 1930 because the processor device 1920 can retrieve the information from the network. It should be noted that each distributed processor that makes up processor device 1920 generally contains its own addressable memory space. It should also be noted that some or all of computer system 1910 can be incorporated into an application-specific or general-use integrated circuit.

Optional video display 1940 is any type of video display suitable for interacting with a human user of apparatus 1900. Generally, video display 1940 is a computer monitor or other similar video display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for performing a solar cell electrical characterization, comprising the steps of:
    opening a shutter of a solar simulator to cause light to be emitted from the solar simulator, the solar simulator being part of a solar cell characterization system having the solar simulator and a continuous neutral density filter having regions of varying light attenuation levels ranging from transparent to opaque, wherein the continuous neutral density filter is located between the solar simulator and a solar cell under test;
    positioning a transparent region of the continuous neutral density filter having no light attenuation between the solar simulator and the solar cell under test;
    obtaining light J-V data from the solar cell under test;
    moving the continuous neutral density filter to position a region of higher light attenuation between the solar simulator and the solar cell under test;
    obtaining Jsc-Voc data from the solar cell under test;
    closing the shutter to prevent light from being emitted from the solar simulator;
    obtaining dark J-V data from the solar cell under test;
    opening the shutter to cause light to be emitted from the solar simulator;
    moving the continuous neutral density filter to position a plurality of regions of lower light attenuation between the solar simulator and the solar cell under test; and
    obtaining three J-V curves from the solar cell under test to obtain RsX data for the solar cell under test.

2. The method of claim 1, further comprising the step of:
    using the RsX data to calculate series resistance for the solar cell under test.

3. The method of claim 1, wherein the continuous neutral density filter is moved to three different regions of lower light attenuation, and wherein the RsX data is obtained from the solar cell under test for each of the three regions of lower light attenuation.

4. The method of claim 1, further comprising the step of:
    calculating one or more of efficiency (Eff), fill factor (FF), short circuit current (Jsc) and open circuit voltage (Voc) from the light J-V data.

5. The method of claim 1, further comprising the step of:
    calculating one or more of pseudo-efficiency (PEff) and pseudo fill factor (PFF) from the Jsc-Voc data.

6. The method of claim 1, further comprising the step of:
    calculating one or more of diode ideality factors ($n_1$ and $n_2$), reverse saturation current ($J_{01}$ and $J_{02}$), shunt resistance (Rshunt) and series resistance (Rseries) from the dark J-V data.

7. An article of manufacture for performing a solar cell electrical characterization, comprising a machine-readable recordable medium containing one or more programs which when executed implement the steps of:
    opening a shutter of a solar simulator to cause light to be emitted from the solar simulator, the solar simulator being part of a solar cell characterization system having the solar simulator and a continuous neutral density filter having regions of varying light attenuation levels ranging from transparent to opaque, wherein the continuous neutral density filter is located between the solar simulator and a solar cell under test;

positioning a transparent region of the continuous neutral density filter having no light attenuation between the solar simulator and the solar cell under test;

obtaining light J-V data from the solar cell under test;

moving the continuous neutral density filter to position a region of higher light attenuation between the solar simulator and the solar cell under test;

obtaining Jsc-Voc data from the solar cell under test;

closing the shutter to prevent light from being emitted from the solar simulator;

obtaining dark J-V data from the solar cell under test;

opening the shutter to cause light to be emitted from the solar simulator;

moving the continuous neutral density filter to position a plurality of regions of lower light attenuation between the solar simulator and the solar cell under test; and obtaining three J-V curves from the solar cell under test to obtain RsX data for the solar cell under test.

\* \* \* \* \*